(12) United States Patent
Hinata et al.

(10) Patent No.: US 12,046,539 B2
(45) Date of Patent: Jul. 23, 2024

(54) SEMICONDUCTOR MODULE COMPRISING A RESIN CASE AND AN EXTERNAL CONNECTION TERMINAL

(71) Applicant: Fuji Electric Co., Ltd., Kanagawa (JP)

(72) Inventors: Yuichiro Hinata, Nagano (JP); Yuma Murata, Nagano (JP); Naoyuki Kanai, Nagano (JP); Ryoichi Kato, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 184 days.

(21) Appl. No.: 17/542,949

(22) Filed: Dec. 6, 2021

(65) Prior Publication Data

US 2022/0208652 A1 Jun. 30, 2022

(30) Foreign Application Priority Data

Dec. 25, 2020 (JP) .................................. 2020-216615
Oct. 15, 2021 (JP) .................................. 2021-169456

(51) Int. Cl.
| | | |
|---|---|---|
| *H01L 23/495* | (2006.01) | |
| *H01L 23/58* | (2006.01) | |
| *H01R 43/02* | (2006.01) | |
| *H01G 2/00* | (2006.01) | |

(52) U.S. Cl.
CPC ............ *H01L 23/495* (2013.01); *H01L 23/58* (2013.01); *H01R 43/0221* (2013.01); *H01G 2/00* (2013.01)

(58) Field of Classification Search
CPC ................................................ H01R 43/0221

USPC ...................................................... 257/66, 690
See application file for complete search history.

(56) References Cited

U.S. PATENT DOCUMENTS

| | | | |
|---|---|---|---|
| 2009/0002956 A1* | 1/2009 | Suwa | B60L 1/003 361/728 |
| 2014/0203420 A1 | 7/2014 | Miyasaka et al. | |
| 2020/0023465 A1 | 1/2020 | Okumoto | |
| 2021/0098347 A1 | 4/2021 | Hayashiguchi et al. | |
| 2021/0202372 A1 | 7/2021 | Kato et al. | |

FOREIGN PATENT DOCUMENTS

| | | | | |
|---|---|---|---|---|
| CN | 104412383 A | * | 3/2015 | ......... H01L 23/4334 |
| JP | 2007-234694 A | | 9/2007 | |
| JP | 2008-42039 A | | 2/2008 | |
| JP | 2008-66561 A | | 3/2008 | |
| JP | 2016-185067 A | | 10/2016 | |
| JP | 2021-106235 A | | 7/2021 | |
| WO | 2013/039099 A1 | | 3/2013 | |
| WO | 2019/077866 A | | 4/2019 | |
| WO | 2019/239771 A1 | | 12/2019 | |
| WO | 2020/179369 A1 | | 9/2020 | |

* cited by examiner

*Primary Examiner* — Ajay Arora
(74) *Attorney, Agent, or Firm* — CHEN YOSHIMURA LLP

(57) ABSTRACT

A semiconductor module includes a resin case housing a semiconductor element; an insulating layer extending outward from the resin case; and a first external connection terminal extending outward from the resin case, arranged above the insulating layer so as to face the insulting layer, the first external connection terminal having a non-contact portion that is not in contact with the insulating layer in a thickness direction of the insulating layer at a position overlapping the insulating layer in a plan view.

20 Claims, 12 Drawing Sheets

SEMICONDUCTOR MODULE COMPRISING A RESIN CASE AND AN EXTERNAL CONNECTION TERMINAL

BACKGROUND OF THE INVENTION

Technical Field

The present invention relates to a semiconductor module, a semiconductor device, and a method for manufacturing the semiconductor device.

Background Art

A semiconductor module has a built-in power device and has, for example, a power conversion function. Examples of power devices include IGBTs (Insulated Gate Bipolar Transistors), FWDs (Free Wheeling Diodes), and MOSFETs (Metal Oxide Semiconductor Field Effect Transistors). To such a semiconductor module, a large-capacitance capacitor may be connected in the immediate vicinity in order to stabilize the applied DC power supply voltage.

In the semiconductor module and the capacitor, the power supply terminals of the positive electrode and the negative electrode are connected by connecting members. The connection was made by screwing in order to facilitate the connection process. However, in the screw-fastening connection method, the electrical connection portion between the connecting member and the terminal tends to have a high contact resistance as well as significant aging issues at the joint portion. Therefore, as a method of connecting a connecting member and a terminal, a method of bonding by ultrasonic bonding has been proposed (see, for example, Patent Document 1).

In the ultrasonic bonding, ultrasonic vibration is generated while pressing the ultrasonic horn against the portion to be joined with the connecting member overlapped with the terminal. This vibration creates a metallurgical bond at the bonding interface that electrically and mechanically connects the connecting members and terminals.

Since bonding by ultrasonic bonding is a method of applying ultrasonic vibration to a connecting member and terminals, it is necessary to have sufficient strength in a case supporting the terminals so that the case is not deformed by ultrasonic vibration.

On the other hand, laser welding is known in which the connecting members and terminals can be joined to each other without applying physical stress to the connecting members and terminals (see, for example, Patent Document 2). In laser welding, superposed metals are irradiated with a condensed laser beam, and the superposed metals are locally melted with each other. Then the molten metal is solidified to join the superposed metals. In this way, laser welding melts the metals in the incident direction of the laser beam by locally concentrating the laser energy. Thus, it is necessary to strictly control the amount of heat input to the metals. In some cases, the melted portion may penetrate the overlaid metals. Therefore, in Patent Document 2, a protective member having a melting point higher than that of the metals to be laser welded is arranged on the side opposite to the incident side of the laser beam of the superposed metals. As a result, even if there is penetration due to welding, the protective member stops the progress of melting, so that damage to the surroundings due to the molten portion can be suppressed.

As for the semiconductor module connected to the capacitor, a technique of providing the following terminal portions is also known. As the terminal portion of the semiconductor module, a first power terminal, an insulating sheet, and a second power terminal are overlaid in that order, a part of the first power terminal is exposed from the insulating sheet, and the second power terminal is positioned on the insulating sheet so as to sandwich that part and the terrace portion of the insulating sheet, thereby forming a terminal laminated portion (see, for example, Patent Document 3). In such a terminal laminated portion, the first connection terminal and the second connection terminal of a capacitor are laser welded to the first power terminal exposed from the insulating sheet and the second power terminal on the insulating sheet, respectively.

Further, regarding laser welding, there is known a technique of providing a gap between an upper terminal and a lower terminal, which are internal wiring members of a semiconductor device, when laser welding the upper terminal and the lower terminal (see, for example, Patent Document 4).

In addition, regarding laser welding, there is known a technique in which a spacer with a gap hole is inserted between a lead frame as a lead material for internal wiring of a semiconductor device and a heat spreader, which is a member to be joined to the lead frame, and the lead frame and the heat spreader are laser welted by radiating a laser beam to the position of the gap hole (see, for example, Patent Document 5).

Further, a technique is known in which an electric wiring board including the DC positive electrode wiring plate and the DC negative electrode wiring plate of a power module used in an inverter device in a power conversion device is laser welded to the positive electrode conductor plate and the negative electrode conductor plate of a capacitor module of the power conversion device (see, for example, Patent Document 6).

Further, a technique is known in which a metal plate (electrode member) arranged on a main surface of a semiconductor device bonded to a conductive substrate (conductive member) is connected by laser welding to a lead member (connecting member) that electrically connects to another conductive substrate (conductive member) (see, for example, Patent Document 7).

Further, a technique is known in which a first terminal portion and a second terminal portion, which sandwich an insulating member, of a semiconductor device, are electrically connected by laser welding to a first supply terminal and a second supply terminal, which sandwich an insulating member, of a bus bar such that the first supply terminal conducts to the first terminal portion and the second supply terminal conducts to the second terminal portion (see, for example, Patent Document 8).

RELATED ART DOCUMENT

Patent Document

Patent Document 1: Japanese Patent Application Laid-Open Publication No. 2007-234694
Patent Document 2: PCT International plication Publication No. 2019/077866 Pamphlet
Patent Document 3: Japanese Unexamined Patent Publication No. 2021-106235
Patent Document 4: PCT International Application Publication No. 2013/039099 Pamphlet
Patent Document 5: Japanese Patent Application Laid-Open Publication No, 2008-66561

Patent Document 6: Japanese Patent Application Laid-Open Publication No. 2016-185067
Patent Document 7: PCT International Application Publication No. 2020/179369 Pamphlet
Patent Document 8: PCT International Application Publication No. 2019/239771 Pamphlet

SUMMARY OF THE INVENTION

Conventionally, regarding laser welding, as described in Patent Document 2, for example, a technique is known in which a protective member having a higher melting point than the metal to be laser welded is provided on the side opposite to the side from which the laser beam is incident towards a laminated metal structure so that the protective member stops the progress of melting and prevents damage to the periphery area due to the molten portion even if there is penetration due to the laser welding.

However, when, as shown in Patent Document 3, the terminal portion of the semiconductor module to which the capacitor is connected has a laminated structure in which a sheet-shaped insulating layer is sandwiched between the external terminals of the positive electrode and the negative electrode, the insulating layer is arranged on the back surface opposite to the side irradiated with the laser. Therefore, the structure is such that the protective member cannot be placed on that side. Therefore, when penetration occurs due to welding, the insulating layer is subjected to thermal stress and the properties of the material of that portion of the insulating layer are deteriorated, whereby the original insulating performance cannot be maintained and the withstand voltage is lowered.

The present invention has been made in view of these points, and an object of the present invention is to provides a semiconductor module in which the heat of the molten portion is less likely to be transferred to the insulating layer when the terminal of the capacitor is laser welded to the terminal portion having a laminated structure.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: a resin case housing a semiconductor element; an insulating layer extending outward from the resin case; and a first external connection terminal extending outward from the resin case, arranged above the insulating layer so as to face the insulating layer, the first external connection terminal having a non-contact portion that is not in contact with the insulating layer in a thickness direction of the insulating layer at a position overlapping the insulating layer in a plan view.

In another aspect, the present disclosure provides a semiconductor device that includes: the above-described semiconductor module; and a capacitor having a first terminal and a second terminal, wherein the first external connection terminal and the second terminal of the capacitor are electrically connected by laser welding via a laser welded portion of the first external connection terminal.

In another aspect, the present disclosure provides a method of manufacturing a semiconductor device, comprising: preparing a semiconductor module that includes: a resin case housing a semiconductor element, an insulating layer extending outward from the resin case, and a first external connection terminal extending outward from the resin case, arranged above the insulating layer so as to face the insulating layer, the first external connection terminal having a non-contact portion that is not in contact with the insulating layer in a thickness direction of the insulating layer at a position overlapping the insulating layer in a plan view; preparing a capacitor having a first terminal and a second terminal; and electrically connecting the first external connection terminal of the semiconductor module and the second terminal of the capacitor by laser welding via a laser welded portion.

In the semiconductor module having the above configuration, the heat of the molten portion due to laser welding is blocked by the non-contact portion and is not directly transmitted to the insulating layer, so that the insulating layer is not altered by the heat of the molten portion and the withstand voltage of the terminal portion is not lowered.

It is to be understood that both the foregoing general description and the following detailed description are exemplary and explanatory, and are intended to provide further explanation of the invention as claimed.

BRIEF DESCRIPTION OF THE DRAWINGS

FIG. 2A is a plan view of a first external connection terminal, and FIG. 2B is a front view of the first external connection terminal as seen from the tip side in the extension direction of the first external connection terminal. FIG. 2C is a side view of the first external connection terminal, and FIG. 2D is a cross-sectional view of a welded portion of the terminal portion.

FIGS. 3A and 3B are drawings for explaining the effect of the present invention, in which FIG. 3A shows the temperature distribution of the terminal portion when there is no non-contact portion, and FIG. 3B shows the temperature distribution of the terminal portion when there is a non-contact portion.

FIG. 4A is a plan view of a first external connection terminal, and FIG. 4B is a front view as seen from the tip side in the extension direction of the first external connection terminal. FIG. 4C is a side view of the first external connection terminal, and FIG. 4D is a cross-sectional view of a welded portion of the terminal portion.

FIG. 5A is a plan view of a first external connection terminal, and FIG. 5B is a front view as seen from the tip side in the extension direction of the first external connection terminal. FIG. 5C is a side view of the first external connection terminal, and FIG. 5D is a cross-sectional view of a welded portion of the terminal portion.

DETAILED DESCRIPTION OF EMBODIMENTS

Hereinafter, embodiments of the present invention are described in a case where a terminal has a laminated structure made up with a second external connection terminal, an insulating layer, and a first external connection terminal, and a capacitor terminal is joined to the first external connection terminal by laser welding with reference to the drawings.

First Embodiment

Figure 1:
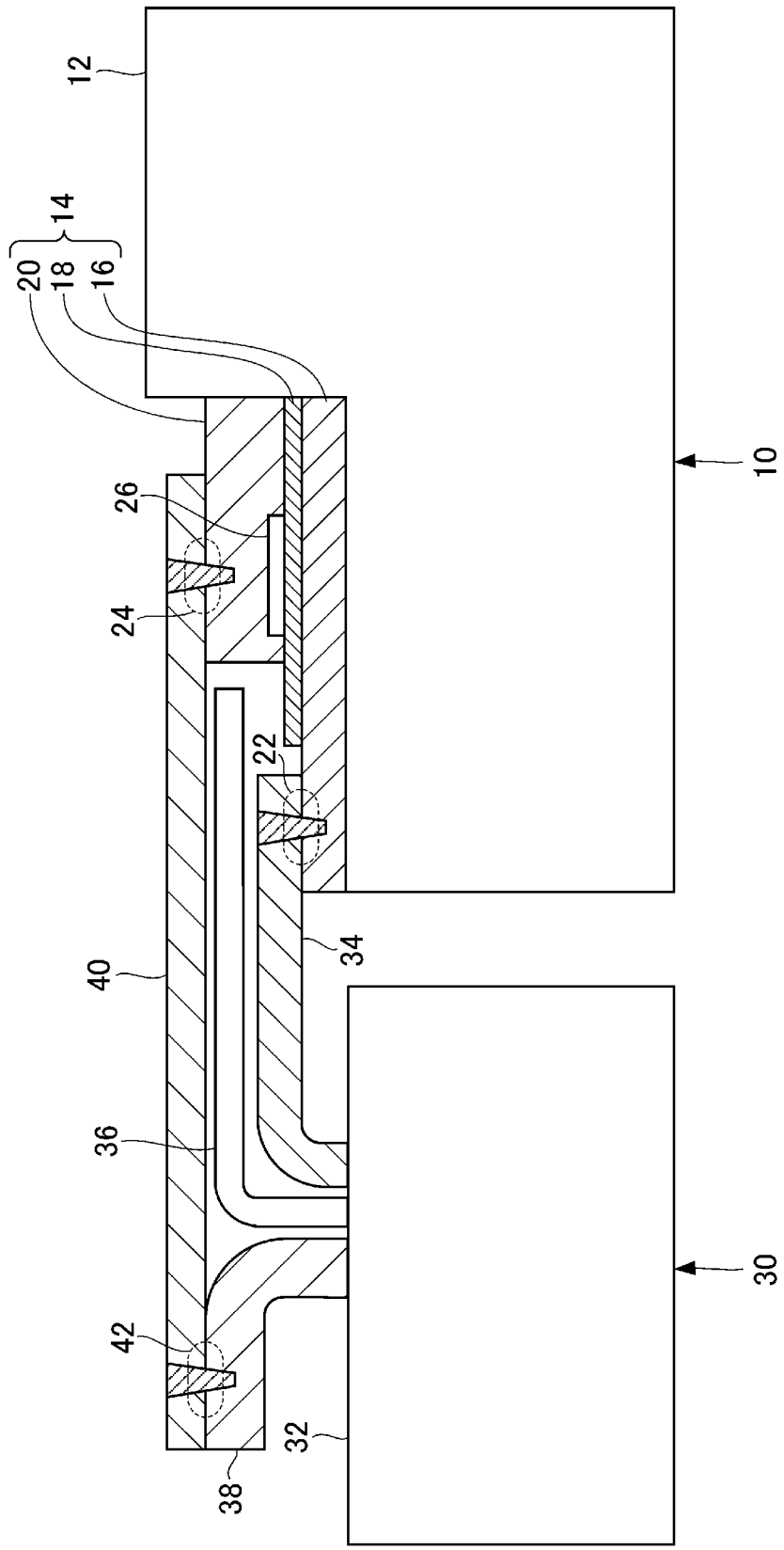
FIG. 1 is a cross-sectional drawing which shows the connection structure of a semiconductor module according to a first embodiment.
Figure 2A:
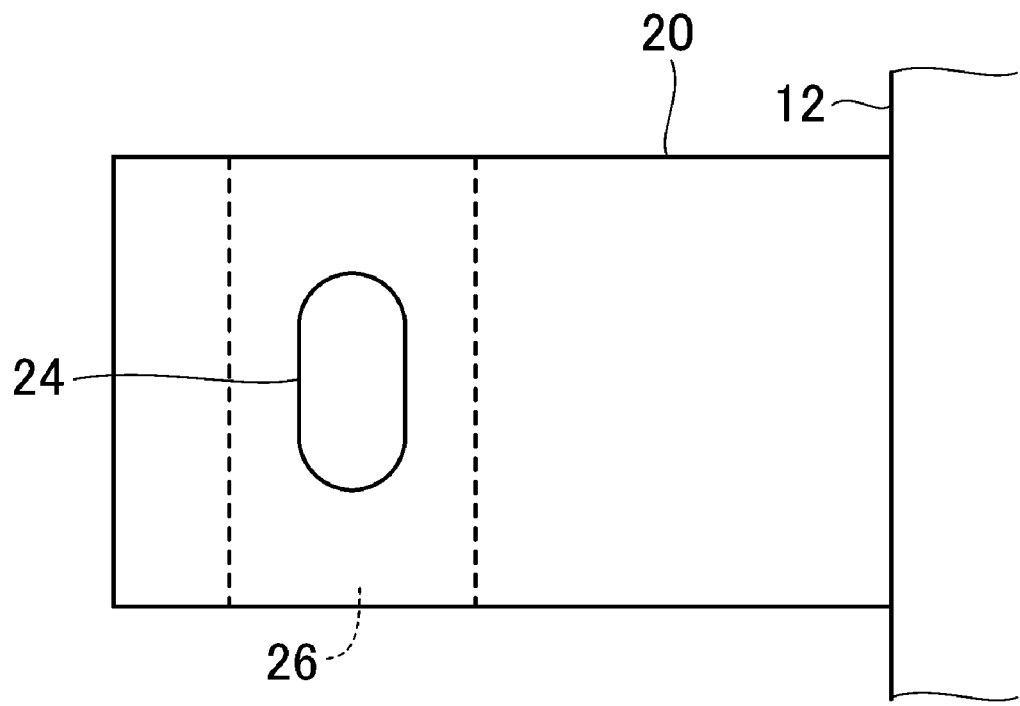
FIGS. 2A-2D are drawings for explaining a terminal portion of the semiconductor module according to the first embodiment.
Figure 2B:
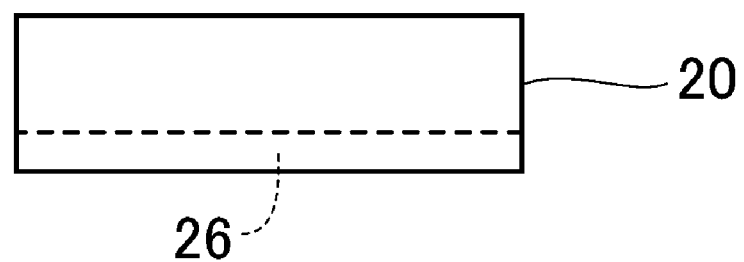
Figure 2C:
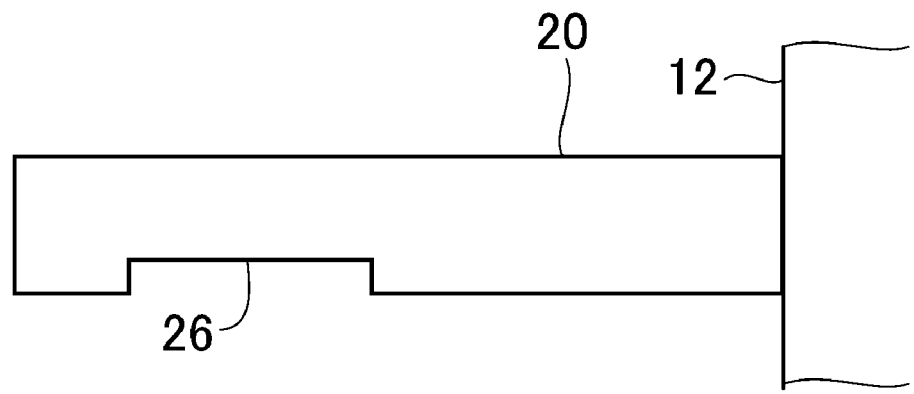
Figure 2D:
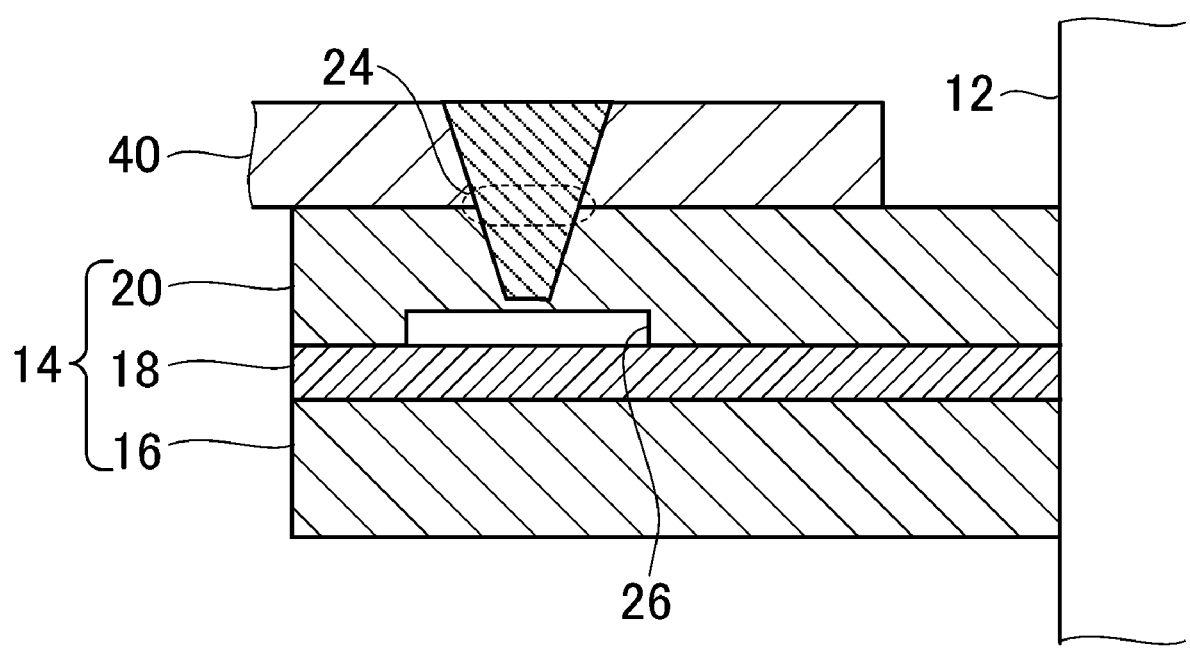
Figure 3A:
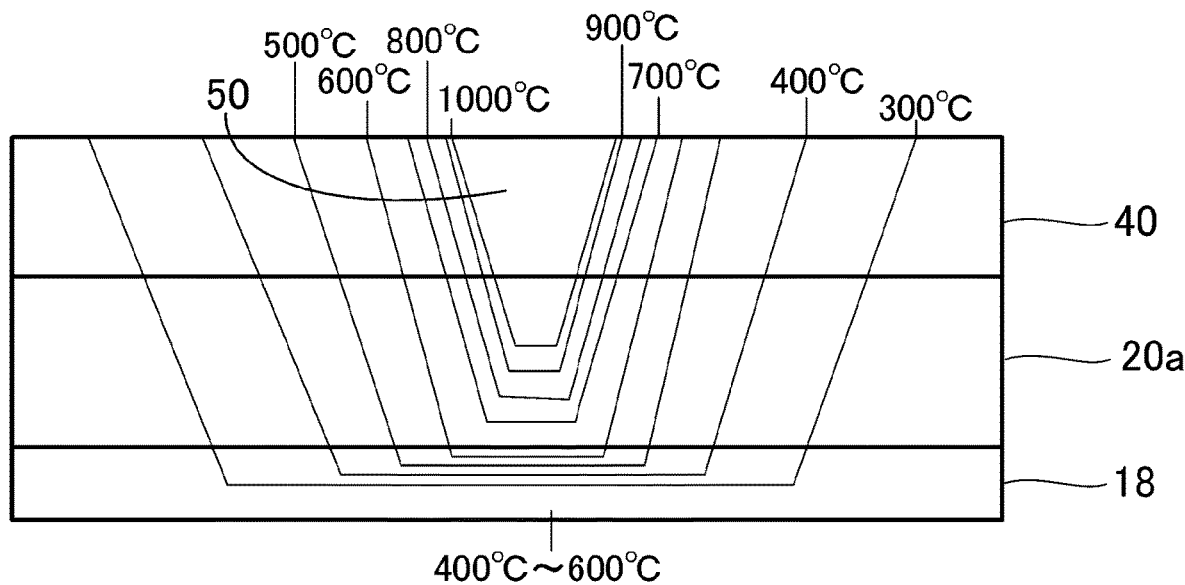
Figure 3B:
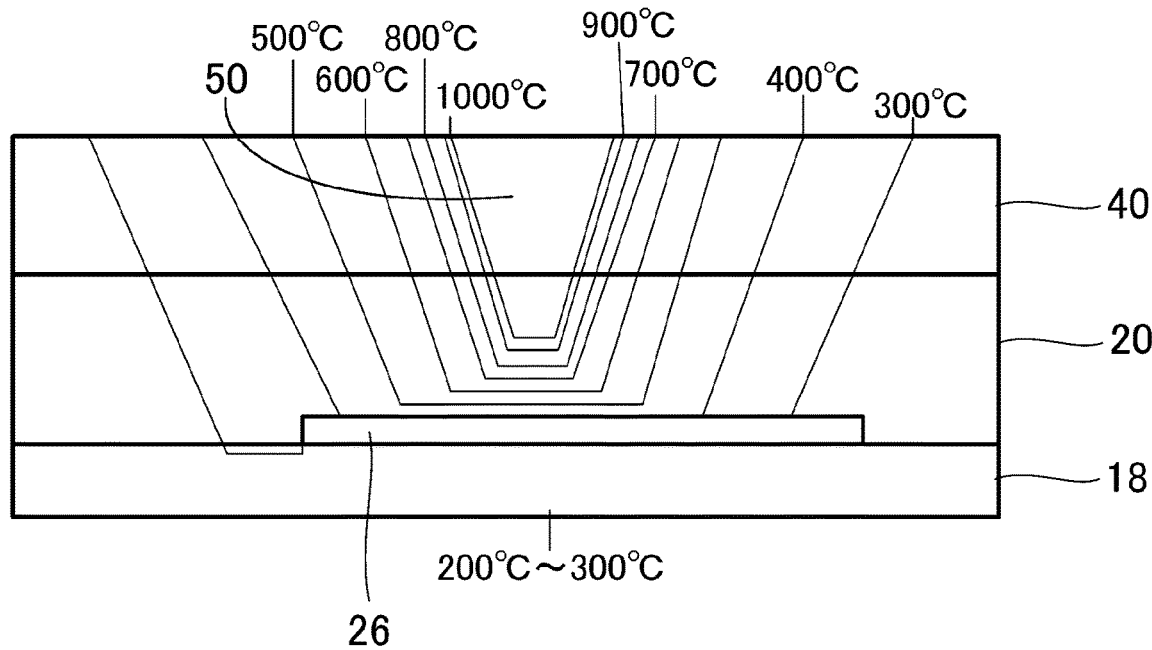

FIG. 1 is a cross-sectional view showing a connection structure of a semiconductor module according to a first embodiment. FIGS. 2A-2D are drawings for explaining the terminal portion of the semiconductor module according to the first embodiment, FIG. 2A is a plan view of the first external connection terminal, and FIG. 2B is a front view as seen from the tip side in an extension direction of the first external connection terminal. FIG. 2C is a side view of the first external connection terminal, and FIG. 2D is a cross-sectional view of a welded portion of the terminal portion. FIGS. 3A and 3B are drawings for explaining the effect of the embodiment, in which FIG. 3A shows the temperature distribution of the terminal portion when there is no non-contact portion, and FIG. 3B shows the temperature distribution of the terminal portion when there is a non-contact portion.

As shown in FIG. 1, the semiconductor module 10 according to the first embodiment has a resin case 12 and a terminal portion 14 extending to the outside from the resin case 12. The resin case 12 houses one or more power devices that perform power conversion.

The terminal portion 14 has a second external connection terminal 16, an insulating layer 18, and a first external connection terminal 20, and has a laminated structure in which the insulating layer 18 is arranged on the second external connection terminal 16 and the first external connection terminal 20 is arranged on the insulating layer 18. The second external connection terminal 16, the insulating layer 18, and the first external connection terminal 20 of the terminal portion 14 may respectively have a shape that extends linearly to the inside of the resin case 12, for example. The second external connection terminal 16 of the terminal portion 14 is connected to, for example, the negative power supply terminal of the circuit including the power devices housed in the resin case 12, and the first external connection terminal 20 is connected to, for example, the positive power supply terminal of the circuit including the power devices.

The capacitor 30 is an external element connected to the semiconductor module 10, and has a resin case 32, a negative electrode terminal (first terminal) 34, a sheet-shaped flexible insulating member 36, and a positive electrode terminal (second terminal) 38. The negative electrode terminal 34, the flexible insulating member 36, and the positive electrode terminal 38 extend from the upper part of the resin case 32. The negative electrode terminal 34 is bent to the right in the figure after coming out of the resin case 32, and extends parallel to the upper surface of the resin case 32. After coming out of the resin case 32, the positive electrode terminal 38 is bent to the left in the figure at a position higher than the negative electrode terminal 34, and extends parallel to the upper surface of the resin case 32.

To connect the semiconductor module 10 and the capacitor 30, the second external connection terminal 16 of the terminal portion 14 of the semiconductor module 10 is directly bonded to the negative electrode terminal 34 of the capacitor 30, and the first external connection terminal 20 of the terminal portion 14 of the semiconductor module 10 is electrically connected to the positive electrode terminal 38 of the capacitor 30 through a flat plate-shaped connecting member 40. The second external connection terminal 16 and the negative electrode terminal 34 of the capacitor 30 are electrically connected to each other by melting and solidifying at the welding portion 22, which is the connection portion, by laser welding. The positive electrode terminal 38 of the capacitor 30 and the connecting member 40 are electrically connected to each other by melting and solidifying at the welding portion 42, which is the connecting portion, by laser welding, and the connecting member 40 and the first external connection terminal 20 of the terminal portion 14 are electrically connected to each other by melting and solidifying at the welding portion 24, which is the connection portion, by laser welding.

The above laser welding is first performed at the welded portion 22. Then, the flexible insulating member 36 is bent so as to cover the welded portion 22, and the connecting member 40 is placed on the first external connection terminal 20 and the positive electrode terminal 38. Thereafter, laser welding processes of the welded portion 42 and the welded portion 24 are performed in that order. As a result, the conductors of the negative electrode and the positive electrode are arranged in parallel between the semiconductor module 10 and the capacitor 30 with the insulating layer 18 and the flexible insulating member 36 interposed therebetween, so that the inductance of the connecting portion is reduced.

The first external connection terminal 20 has a groove portion (non-contact portion) 26, which is a recess, on the surface opposite to the surface where the welded portion 24 melted by laser welding is located, that is, on the surface in contact with the insulating layer 18. As shown in FIG. 2A, the groove 26 of the first external connection terminal 20 is formed on the surface that is directly below the welded portion 24 to be irradiated with the laser beam and that is in contact with the insulating layer 18, and is disposed to extend in a direction intersecting the extension direction of the terminal portion 14 from the resin case 12 (vertical direction in FIG. 2A). The groove 26 is a non-contact portion that does not come into contact with the insulating layer 18. In other words, the groove portion 26 forms an air layer that does not come into direct contact with the insulating layer 18 directly below the welded portion 24. Therefore, when the welded portion 24 becomes hotter than the melting point of the first external connection terminal 20 by laser welding, the heat is blocked by the groove portion 26 and is not directly transmitted to the insulating layer 18, so that the thermal damage to the insulating layer 18 that is located directly under the welded portion 24 is significantly reduced. The first external connection terminal 20 is formed by pressing a mold against a portion to be a groove 26 and plastically deforming the first external connection terminal 20 to form a stepped shape or by cutting. Here, in this example, the first external connection terminal 20 forms a groove 26 on an inner side of the tip in the extension direction and is in contact with the insulating layer 18 at the tip so as to press the insulation layer 18 at the tip. However, when the rigidity of the insulating layer 18 is sufficiently high, it is not necessary to press the insulating layer 18 at the tip. In such a case, the non-contact portion of the first external connection terminal 20 may be extended to the tip of the first external connection terminal 20.

Here, the connecting member 40 and the first external connecting terminal 20 are made of a metal having excellent conductivity, for example, copper or a copper alloy, and have a thickness of 0.8 mm to 3.0 mm. The depth of the groove portion 26 is preferably no greater than about ⅓ of the thickness of the first external connection terminal 20, preferably 0.05 mm to 1.0 mm, and more preferably 0.1 mm. The connecting member 40 to be irradiated with the laser light may be nickel-plated or its surface processed to be roughened at least in the region of the irradiation position so that the reflection of the laser light can be suppressed and the laser light can be absorbed as much as possible at the irradiation position, depending on the type of the laser light source. The insulating layer 18 is, for example, a sheet-like material having a thickness of about 0.2 mm to 0.5 mm, made of an insulating paper made of fully aromatic polyamide polymer, a fluorine-based resin material, or a polyimide-based resin material, and has a heat-resistant temperature of about 300° C. to 400° C.

FIGS. 3A-3B illustrate the temperature distributions in the vicinity of the welded portion 24 when the connecting member 40 and the first external connecting terminal 20 are laser welded in a state where the connecting member 40, the first external connection terminal 20 and the insulating layer 18 are laminated. That is, when the irradiation time is controlled so that the molten portion 50 penetrates the connecting member 40 and reaches the first external connection terminal 20, because the melting point of copper is 1085° C., the molten portion 50 becomes 1000° C. or higher. As a result, heat is transmitted concentrically from the molten portion 50 to the surroundings.

As illustrated in FIG. 3A, when the first external connection terminal 20a having no non-contact portion on the surface on the side of the insulating layer 18 is used, in the illustrated example, the temperature of the insulating layer 18 reaches 400° C. to 600° C. In this case, the insulating layer 18 is deteriorated by heat, and the withstand voltage may drop from 1000 V to 500 V.

On the other hand, as illustrated in FIG. 3B, when the first external connection terminal 20 having the groove 26 on the surface on the side of the insulating layer 18 is used, in the illustrated example, the temperature of the insulating layer 18 is suppressed to 200° C. to 300° C. Therefore, as the insulating layer 18, not only a material having a low heat resistant temperature can be used, but also the insulating layer 18 is not subjected to deterioration due to heat, so that characteristic deterioration such as a decrease in withstand voltage does not occur.

Second Embodiment

Figure 4A:
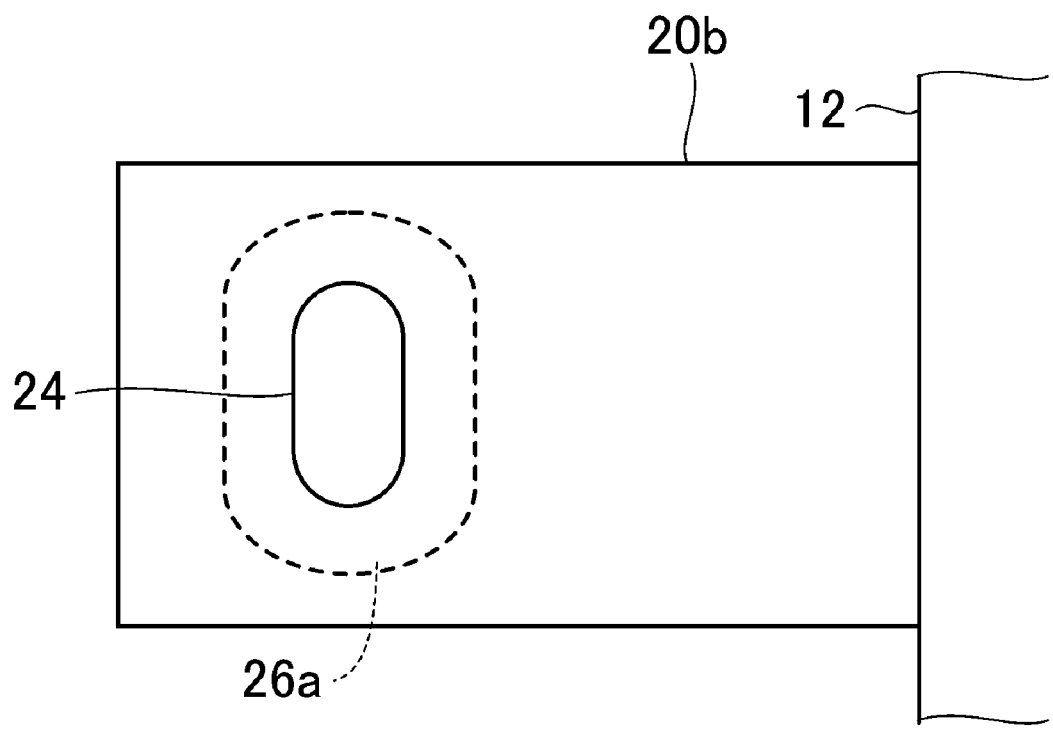
FIGS. 4A-4D are drawings for explaining a terminal portion of a semiconductor module according to a second embodiment, where
Figure 4B:
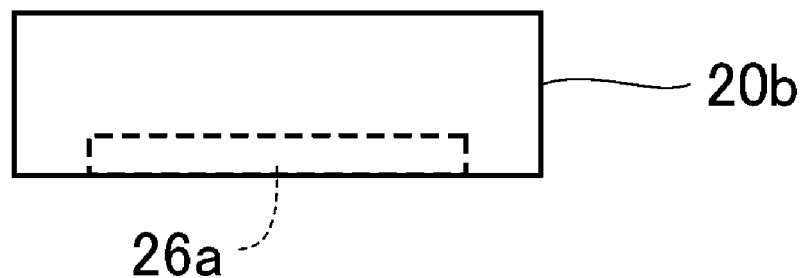
Figure 4C:
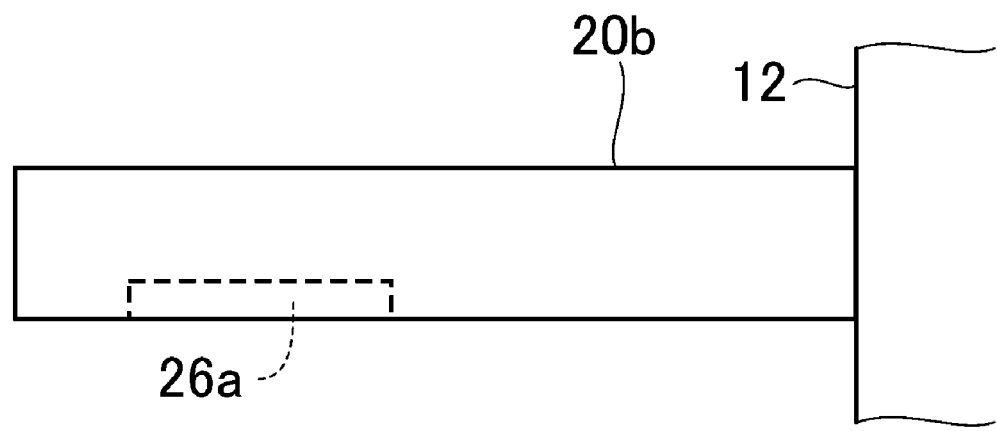
Figure 4D:
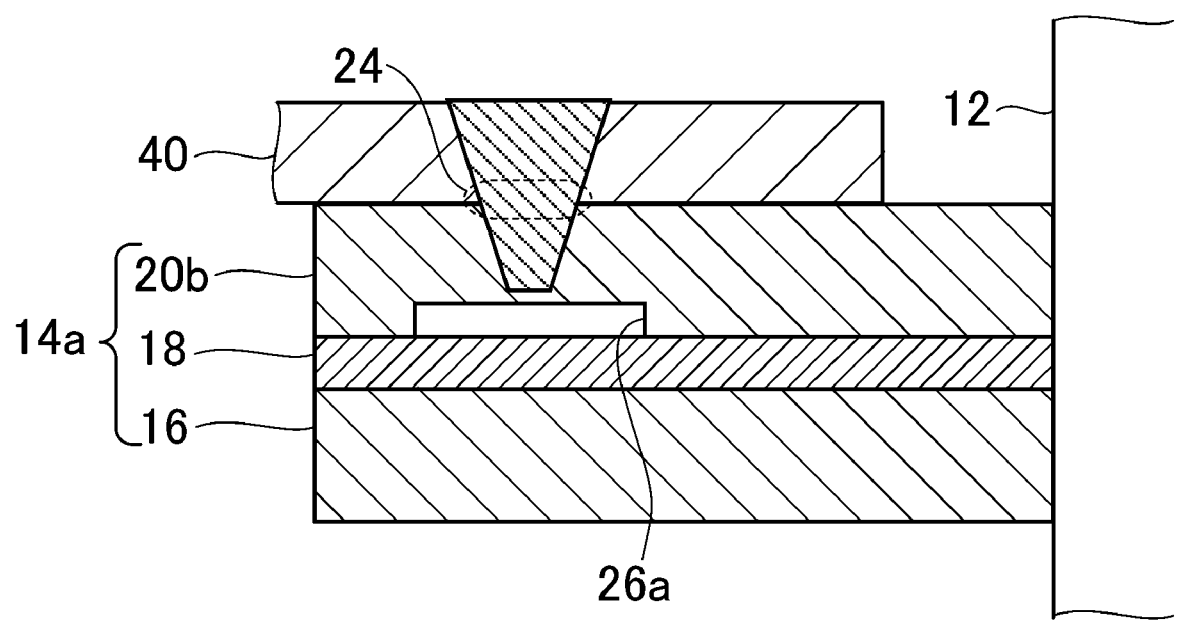

FIGS. 4A-4D are drawings for explaining the terminal portion of the semiconductor module according to a second embodiment, FIG. 4A is a plan view of the first external connection terminal, and FIG. 4B is a front view as seen from the tip side in an extension direction of the first external connection terminal. FIG. 4C is a side view of the first external connection terminal, and FIG. 4D is a cross-sectional view of a welded portion of the terminal portion.

The terminal portion 14a of the semiconductor module according to the second embodiment has a second external connection terminal 16, an insulating layer 18, and a first external connection terminal 20b. The second external connection terminal 16, the insulating layer 18, and the first external connection terminal 20b have a structure in which they are laminated in this order. The second external connection terminal 16, the insulating layer 18, and the first external connection terminal 20b of the terminal portion 14a may respectively have a shape that extends linearly to the inside of the resin case 12, for example.

The first external connection terminal 20b has an oval-shaped recess (non-contact portion) 26a in a plan view directly below the welded portion 24 on a surface on the side where the insulating layer 18 is located. The recess 26a is formed, for example, by providing a step by crushing deformation. Alternatively, the recess 26a may have a shape of a rectangle having steps on all of the sides.

In the first external connection terminal 20b, The recess 26a constitutes a non-contact portion in which the recess 26a provided directly below the welded portion 24 does not come into direct contact with the insulating layer 18. Therefore, even if the welded portion 24 becomes hotter than the melting point of the first external connection terminal 20b by laser welding, the heat is blocked by the air layer in the recess 26a and is not directly transmitted to the insulating layer 18. Thus the insulating layer 18 is not thermally damaged.

Third Embodiment

Figure 5A:
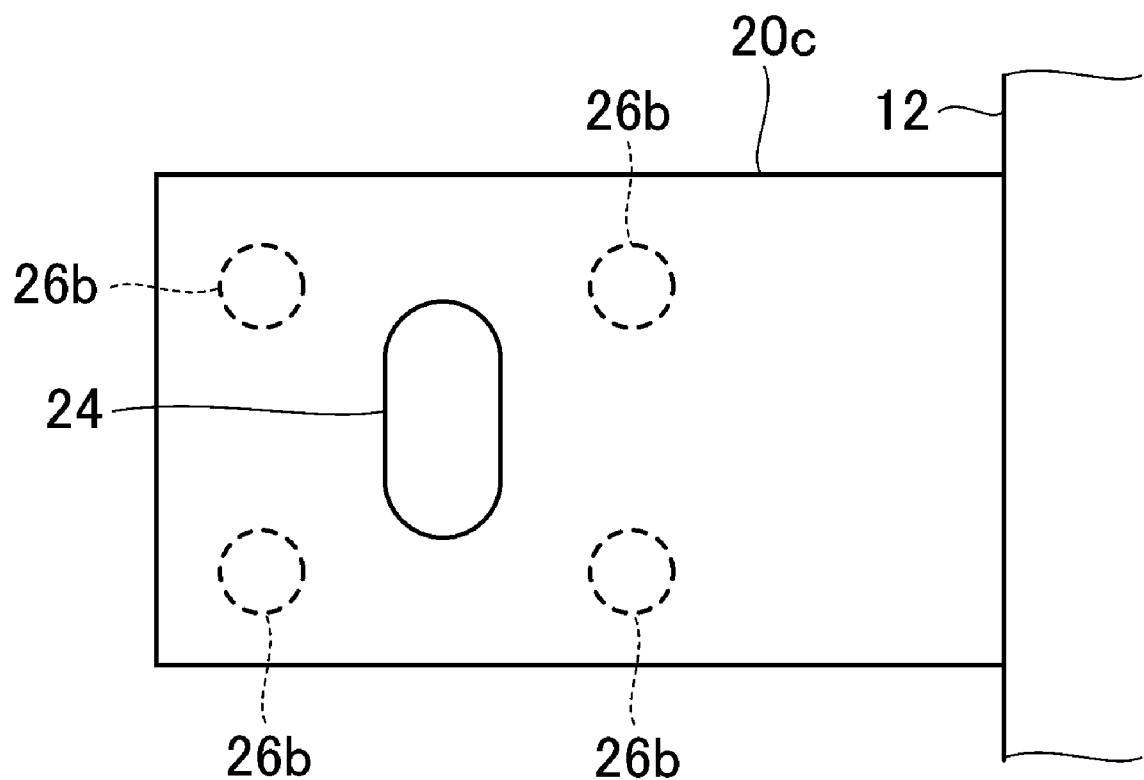
FIGS. 5A-5D are drawings for explaining a terminal portion of a semiconductor module according to a third embodiment, where
Figure 5B:
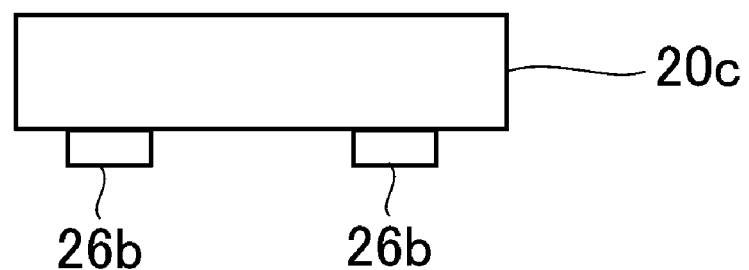
Figure 5C:
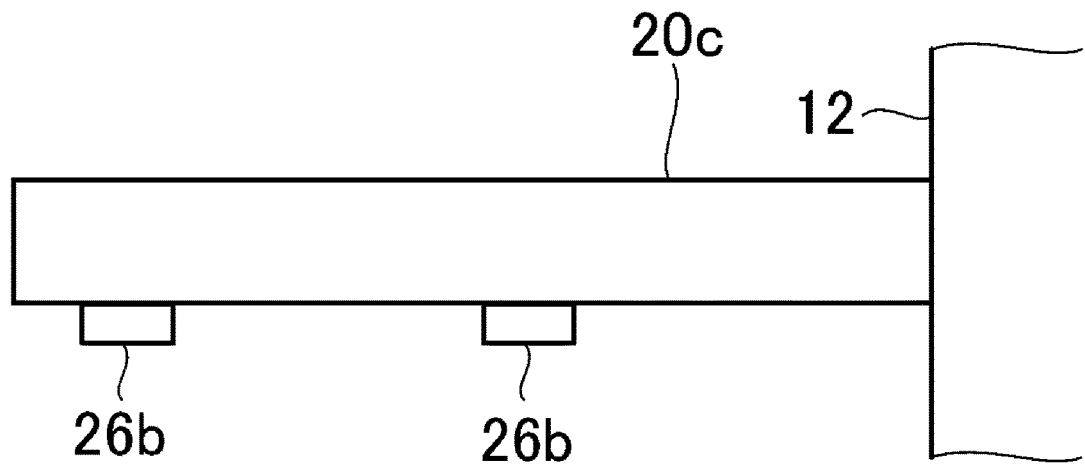
Figure 5D:
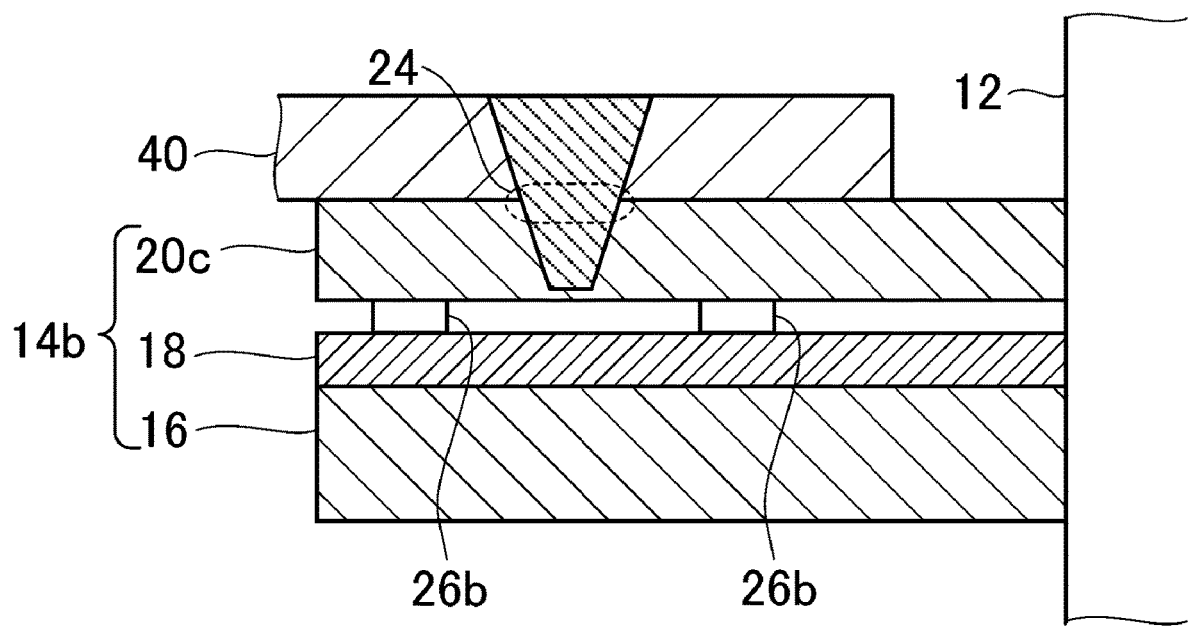

FIGS. 5A-5D are drawings for explaining the terminal portion of the semiconductor module according to a third embodiment, FIG. 5A is a plan view of the first external connection terminal, and FIG. 5B is a front view as seen from the tip side in an extension direction of the first external connection terminal. FIG. 5C is a side view of the first external connection terminal, and FIG. 5D is a cross-sectional view of a welded portion of the terminal portion.

The terminal portion 14b of the semiconductor module according to the third embodiment has a second external connection terminal 16, an insulating layer 18, and a first external connection terminal 20c. The second external connection terminal 16, the insulating layer 18, and the first external connection terminal 20c have a structure in which they are laminated in this order. The second external connection terminal 16, the insulating layer 18, and the first external connection terminal 20c of the terminal portion 14b may respectively have a shape that extends linearly to the inside of the resin case 12, for example. The first external connection terminal 20c of the terminal portion 14b may be formed, for example, so as to be extended inside the resin case 12 and bent so as to be in contact with the insulating layer 18 inside the resin case 12.

The first external connection terminal 20c has protrusions 26b that serve as a spacer in the vicinity of the region directly below the welded portion 24 on the surface on the side where the insulating layer 18 is located so as to create a non-contact portion that does not come into contact with the insulating layer 18. The protrusion 26b is formed by attaching a cylindrical member by, for example, a fixing means such as bonding or implanting to the surface of the first external connection terminal 20c opposite to the welded portion 24. Alternatively, preferably, the protruding portion 26b may be a bulging portion formed by pushing a punch into a plate-shaped copper plate in the incident direction of the laser beam and extruding it to the opposite surface by a half blanking process. In the illustrated example, the first external connection terminal 20c has four protrusions 26b, but the number of protrusions 26b is not limited to this number, and the number of protrusions 26b may be one or more. The protrusion 26b may also be arranged farther from the resin case 12 than the region forming the non-contact portion.

The protrusions 26b of the first external connection terminal 20c may be positioned such that the distance from the resin case 12 to the protrusion 26b is greater than a half of the distance from the resin case 12 to the tip (end) of the first external connection terminal 20c, for example. In other words, the protrusions 26b is arranged at a position farther away from the resin case 12 than half the distance from the resin case 12 towards the tip of the first external connection terminal 20c in the extending direction.

Also in this first external connection terminal 20c, since the surface opposite to the surface of the welded portion 24 is floated from the insulating layer 18 by the protrusions 26b, there exists a non-contact portion that does not come into direct contact with the insulating layer 18. Therefore, even if the welded portion 24 becomes hotter than the melting point of the first external connection terminal 20c by laser welding, the heat is blocked by the air layer created by the first external connection terminal 20c floating from the insulating layer 18. As a result, the heat generated by laser welding is not directly transmitted to the insulating layer 18, so that the insulating layer 18 is not thermally damaged.

In the terminal portion 14b of the semiconductor module according to the third embodiment, in addition to the protrusion 26b, the first external connection terminal 20c may additionally have the groove 26 of the first embodiment described above directly below the welded portion 24, or may have the recess 26a of the second embodiment directly below the welded portion 24. By adopting such a configuration in which the groove 26 or the recess 26a and the protrusion 26b are combined in the first external connection terminal 20c in this way, a space that is higher from the insulating layer 18 than the height of the protrusion 26b by the depth of the groove 26 or the recess 26a can be formed directly below the welded portion 24. As a result, the height of the first external connection terminal 20c facing the insulating layer 18 via the protrusion 26b with respect to the insulating layer 18 remains unchanged, yet a larger space can be formed directly below the welded portion 24, as compared with when only the protrusion 26b is formed. Therefore, the effect of blocking the heat of the welded portion 24 at the time of laser welding is enhanced, and the heat transfer to the insulating layer 18 can be suppressed more effectively.

Fourth Embodiment

Figure 6:
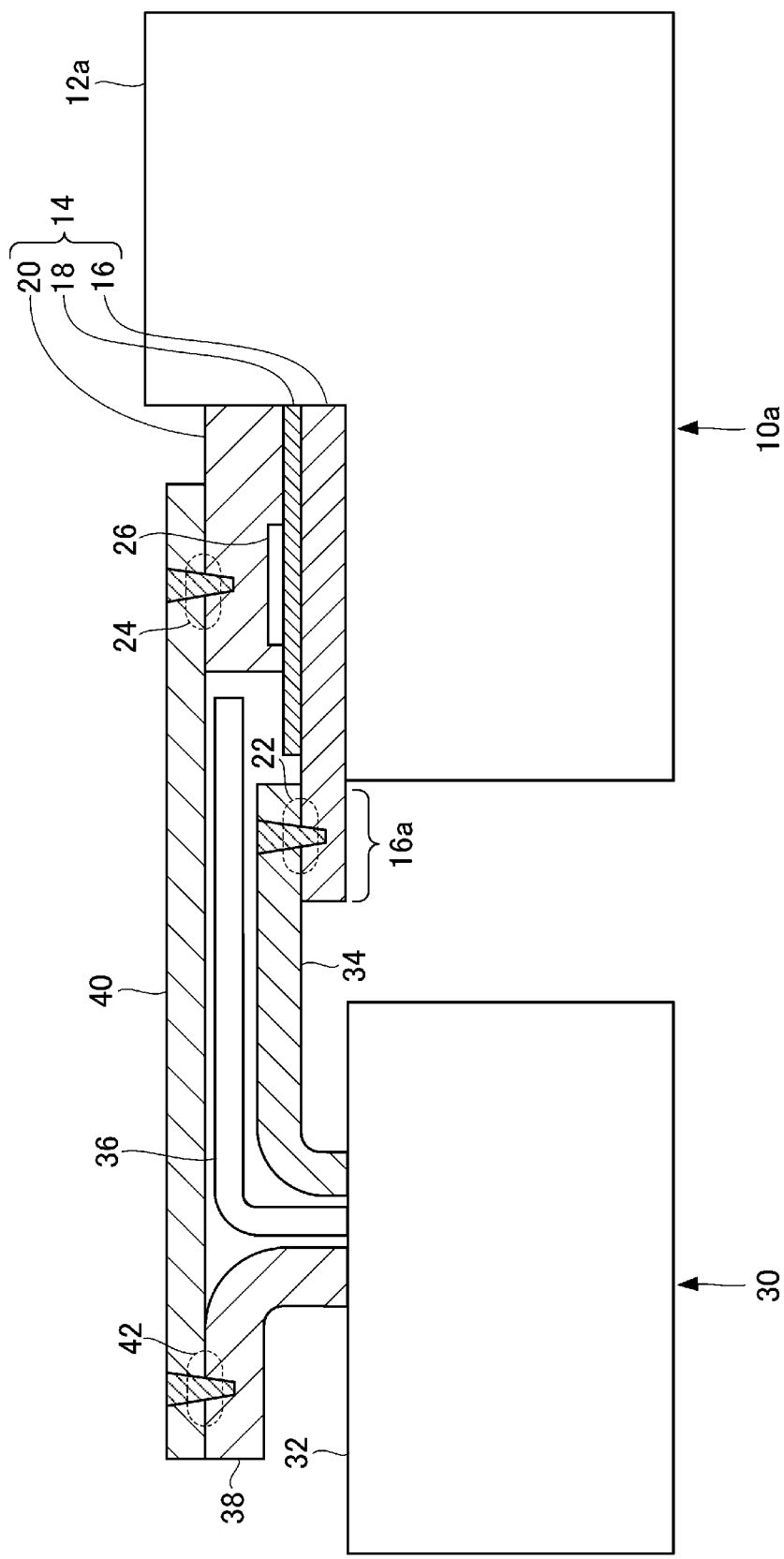
FIG. 6 is a cross-sectional view showing a connection structure of a semiconductor module according to a fourth embodiment.

FIG. 6 is a cross-sectional view showing a connection structure of the semiconductor module according to a fourth embodiment. In FIG. 6, the same or equivalent components as those shown in FIG. 1 are designated by the same reference numerals, and detailed description thereof will be omitted.

The semiconductor module 10a according to the fourth embodiment has a resin case 12a. As compared with the resin case 12 of the first embodiment, in the resin case 12a, the surface region 16a on the surface opposite to the surface of the second external connection terminal 16 that is joined to the negative electrode terminal 34 of the capacitor 30, directly below the welded portion 22, is not contacted by any structure. The second external connection terminal 16 projects outward from the outer circumference of the resin case 12a by the length of the surface region 16a directly below the welded portion 22 in a plan view.

Since the resin case 12a is formed so as to avoid the surface region 16a directly below the welded portion 22, it is possible to prevent the resin case 12a from being deformed or discolored due to heat that would be transferred to the resin case 12a when the negative electrode terminal 34 of the capacitor 30 is laser welded to the second external connection terminal 16.

The resin case 12a is integrally molded with the terminal portion 14 by insert molding using a thermally flexible resin. The thermally flexible resin is, for example, polyphenylene sulfide (PPS), polybutylene terephthalate (PBT) resin, polybutylene succinate (PBS) resin, polyamide (PA) resin, acrylonitrile butadiene styrene (ABS) resin, or the like. The heat resistant temperature of these resins is about 300° C. to 400° C.

Although FIG. 6 shows an example in which the first external connection terminal 20 of the terminal portion 14 of the resin case 12a has the groove portion 26 of the first embodiment, the form of the terminal portion of the present invention is not limited to the example shown in FIG. 6. For example, the resin case 12a may alternatively have the terminal portion 14a provided with the first external connection terminal 20b having a recess 26a of the second embodiment, may have the terminal portion 14b provided with the first external connection terminal 20c having the protrusion 26b of the third embodiment, or may have a terminal portion in which the groove portion 26 or the recess 26a is provided together with the protrusion 26b. Even if such a terminal portion 14a, a terminal portion 14b, or the like is adopted for the resin case 12a of FIG. 6, the surface region of the second external connection terminal 16 immediately below the portion where the negative electrode terminal 34 of the capacitor 30 is laser welded project outward from the resin case 12a, and therefore, it is possible to prevent heat from being transferred to the resin case 12a during laser welding of the negative electrode terminal 34, thereby preventing deformation or discoloration of the resin case 12a.

Fifth Embodiment

Figure 7:
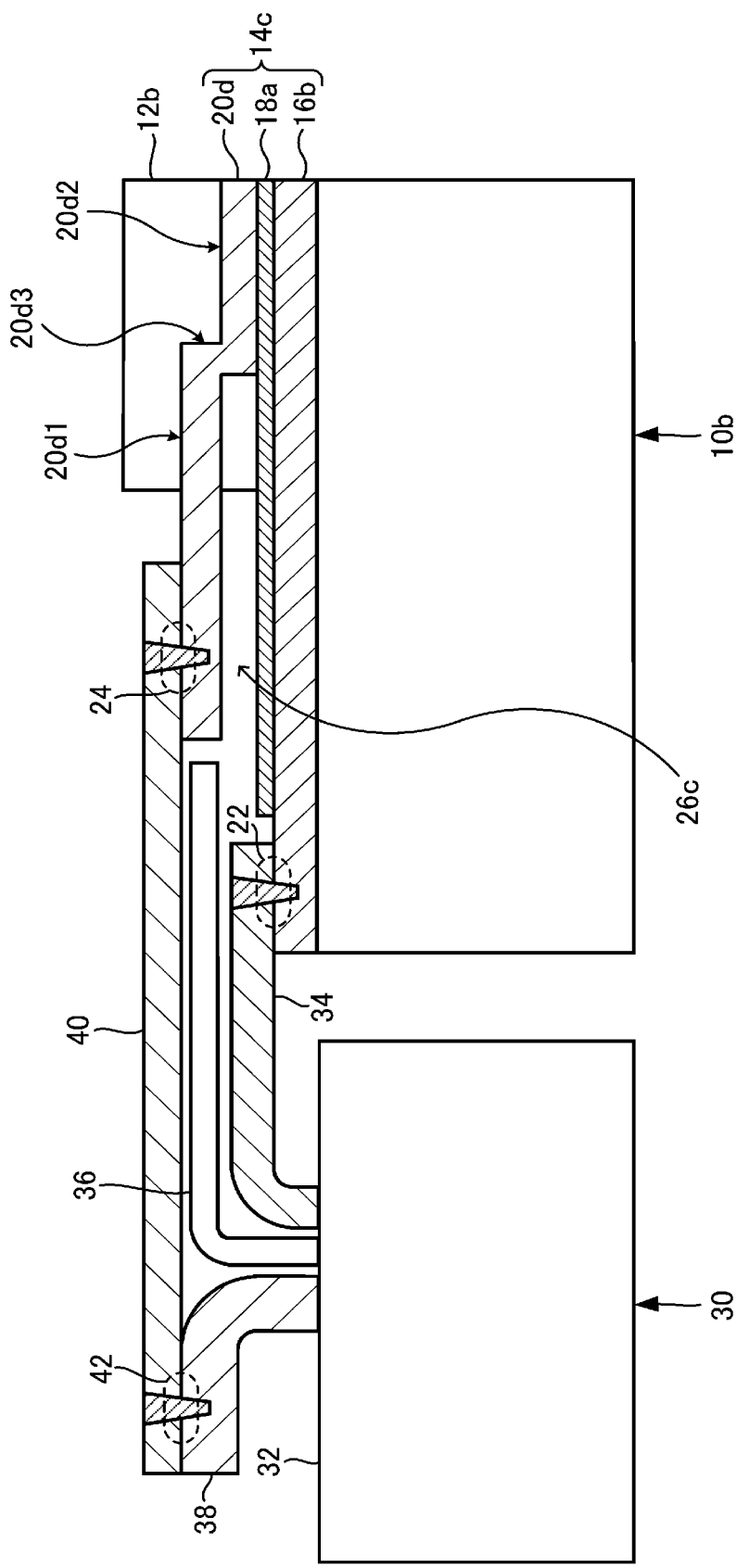
FIG. 7 is a cross-sectional view showing a connection mechanism of a semiconductor module according to a fifth embodiment.

FIG. 7 is a cross-sectional view showing a connection mechanism of a semiconductor module according to a fifth embodiment. In FIG. 7, the same or equivalent components as those shown in FIG. 1 are designated by the same reference numerals, and detailed description thereof will be omitted.

As shown in FIG. 7, the semiconductor module 10b according to the fifth embodiment has a resin case 12b and a terminal portion 14c partially extending outward from the resin case 12b. A plurality of power devices that perform power conversion are housed in the resin case 12b.

The terminal portion 14c has a second external connection terminal 16b, an insulating layer 18a, and a first external connection terminal 20d, and has a laminated structure in which the insulating layer 18a is arranged on the second external connection terminal 16b, and the first external connection terminal 20d is arranged on the insulating layer 18a. The second external connection terminal 16b of the terminal portion 14c is connected to, for example, the negative power supply terminal of a circuit including the power devices housed in the resin case 12b. The first external connection terminal 20d of the terminal portion 14c is connected to, for example, the positive power supply terminal of the circuit including the power devices housed in the resin case 12b.

Here, the second external connection terminal 16b of the terminal portion 14c has a flat plate shape in which a part thereof is sealed in the resin case 12b and arranged inside the resin case 12b, and the other portion extends outward from the resin case 12b. The second external connection terminal 16b extends linearly from the outside to the inside of the resin case 12b. The second external connection terminal 16b has a welded portion 22 in which the negative electrode terminal 34 of the capacitor 30 is welded by laser welding at a portion arranged outside the resin case 12b. A metal having excellent conductivity such as copper or a copper alloy is used for the second external connection terminal 16b.

The the insulating layer 18a of the terminal portion 14c has a sheet shape in which a part thereof is sealed in the resin case 12b and arranged inside the resin case 12b, and the other portion extends outward from the resin case 12b. The insulating layer 18a extends linearly from the outside to the inside of the resin case 12b. For the insulating layer 18a, an insulating paper made of a totally aromatic polyamide polymer, a fluorine-based resin material, a polyimide-based resin material, or the like is used.

The first external connection terminal 20d of the terminal portion 14c has a shape in which a part thereof is sealed in the resin case 12b and arranged inside the in the resin case 12b, and the other portion extends outward from the resin case 12b. The portion of the first external connection terminal 20d that is arranged inside the resin case 12b has a first portion 20d1 that is arranged so as to face the insulating layer 18a, a second portion 20d2 that is in contact with the insulating layer 18a, and a third portion 20d3 that is bent and is connected to the first portion 20d1 and the second portion 20d2 at the respective ends. The first external connection terminal 20d has a welded portion 24 in which the connecting member 40 connected to the positive electrode terminal 38 of the capacitor 30 is welded by laser welding at a portion arranged outside the resin case 12b. A metal having excellent conductivity such as copper or a copper alloy is used for the first external connection terminal 20d.

The portion of the first external connection terminal 20d arranged inside the resin case 12b includes the first portion 20d1 that faces and is separated from the insulating layer 18a and a second portion 20d2 that is in contact with the insulating layer 18a, and has a bent shape at the position of the third portion 20d3 connected to them. The bent shape of the first external connection terminal 20d inside the resin case 12b does not necessarily be a crank shape that is bent twice at 90° as shown in FIG. 7, and may take any bent shape as long as the first portion 20d1 that is connected to the second portion 20d2 in contact with the insulating layer 18a via the third portion 20d3 faces and is separated from insulating layer 18a. In the cross-sectional view as shown in FIG. 7, the angle formed by the second portion 20d2 and the third portion 20d3 is not limited to 90°, and may be an acute angle or an obtuse angle. In the cross-sectional view as shown in FIG. 7, the angle formed by the third portion 20d3 and the first portion 20d1 is not limited to 90°, and may be an acute angle or an obtuse angle. Further, the number of times the first external connection terminal 20d is bent is not limited to two, and may be three or more.

The portion of the first external connection terminal 20d arranged outside the resin case 12b is connected to the first portion 20d1 that is arranged inside the resin case 12b so as to be separated from and face the insulating layer 18a, and extends outward from the resin case 12b. The first external connection terminal 20d extending outward from the resin case 12b is arranged so as to be in parallel with and to be separated from and face the second external connection terminal 16b and the insulating layer 18a thereon. A space (non-contact portion) 26c is provided between the first external connection terminal 20d extending outward from the resin case 12b and the insulating layer 18a on the second external connection terminal 16b. In the semiconductor module 10b, the entire back surface of the portion of the first external connection terminal 20d extending outward from the resin case 12b on the side of the insulating layer 18a is the non-contact portion where the first external connection terminal 20d does not come into contact with the insulating layer 18a.

The distance between the first external connection terminal 20d extending outward from the resin case 12b and the second external connection terminal 16b in the thickness direction of the insulating layer 18a or in the height direction of the space 26c is set in the range of 0.05 mm to 2.0 mm, for example. During operation of the semiconductor module 10b, the first external connection terminal 20d and the second external connection terminal 16b, which face each other in parallel with each other via the insulating layer 18a and the space 26c, have opposite polarities, thereby reducing the inductance therebetween. If the distance between the first external connection terminal 20d and the second external connection terminal 16b exceeds 2.0 mm, the effect of reducing the inductance may become small or may not be obtained. If the distance between the first external connection terminal 20d and the second external connection terminal 16b is less than 0.05 mm, the heat blocking effect due to the space 26c during laser welding as described later may become small or may not be obtained.

The insulating layer 18a provided between the first external connection terminal 20d extending outward from the resin case 12b and the second external connection terminal 16b is shaped in such a way as to secure the insulation distance (creeping distance) between the first external connection terminal 20d and the second external connection terminal 16b via the insulating layer 18a. For example, when the distance between the first external connection terminal 20d and the second external connection terminal 16b in the thickness direction of the insulating layer 18a or in the height direction of the space 26c is set so as to reduce the inductance in between, as described above, the tip of the insulating layer 18a is placed closer to the tip of the second external connecting terminal 16b than the tip of the first external connection terminal 20d. The positions of the tips of the first external connection terminal 20d and the insulating layer 18a in the extending direction are set so as to provide for a sufficient insulation distance between the tip of the first external connection terminal 20d and the second external connecting terminal 16b exposed to the outside from the tip of the insulating layer 18a. Here, with respect to the shape of the insulating layer 18a, in addition to the insulating distance in the cross-sectional view as shown in FIG. 7, the insulating distance in the front-back direction relative to the paper surface of FIG. 7 is also taken into consideration in setting the overall shape of the insulating layer 18a.

The first external connection terminal 20d of the terminal portion 14c is formed by bending a flat plate-shaped member by plastic working or the like using a mold. In the terminal portion 14c, the flat plate-shaped second external connection terminal 16b, the sheet-shaped insulating layer 18a, and the bent first external connection terminal 20d are laminated such that the second external connection terminal 16b is in contact with on one surface of the insulating layer 18a and that the second portion 20d2 and the third portion 20d3 of the first external connection terminal 20d are in contact with the other surface of the insulating layer 18a. The terminal portion 14c is insert-molded with a resin material such as PPS resin used for the resin case 12b in a state where the second external connection terminal 16b, the insulating layer 18a, and the first external connection terminal 20d are laminated in this order so that the terminal portion 14c is integrally molded with the resin case 12b.

Regarding the connection between the semiconductor module 10b and the capacitor 30 as described above, the second external connection terminal 16b of the terminal portion 14c of the semiconductor module 10b is electrically connected by being directly bonded to the negative electrode terminal 34 of the capacitor 30. The first external connection terminal 20d of the terminal portion 14c of the semiconductor module 10b is electrically connected to the positive electrode terminal 38 of the capacitor 30 by being joined via the flat plate-shaped connecting member 40.

In the electrical connection between the second external connection terminal 16b of the terminal portion 14c of the semiconductor module 10b and the negative electrode terminal 34 of the capacitor 30, the negative electrode terminal 34 is arranged on the second external connection terminal 16b, and the welded portion 22 is irradiated with a laser beam from the side of the negative electrode terminal 34 so that the negative electrode terminal 34 and the second external connection terminal 16b are laser welded. The negative electrode terminal 34 and the second external connection terminal 16b are electrically connected by being melted and solidified at the welded portion 22, which is a connecting portion by laser welding. That is, the negative electrode terminal 34 and the second external connection terminal 16b are electrically connected via the welded portion 22 by laser welding.

In the electrical connection between the first external connection terminal 20d of the terminal portion 14c of the semiconductor module 10b and the positive electrode terminal 38 of the capacitor 30 via the connecting member 40, first, the connecting member 40 is placed on the top of the first external connection terminal 20d extending outward from the resin case 12b (on the side opposite to the space 26c) and on the positive electrode terminal 38. Then, a laser beam is irradiated to the welded portion 42 from the side of the connecting member 40 so that the connecting member 40 and the positive electrode terminal 38 are laser welded. Further, the welded portion 24 is irradiated with a laser beam from the side of the connecting member 40 so that the connecting member 40 and the first external connection terminal 20d are laser welded. Here, the order of the laser welding of the welded portion 42 and the laser welding of the welded portion 24 does not matter. The connecting member 40 and the positive terminal 38 are electrically connected by being melted and solidified to each other by laser welding at the welding portion 42, which is a connecting portion, and the connecting member 40 and the first external connection terminal 20d are electrically connected by being melted and solidified to each other by laser welding at the welded portion 24, which is another connecting portion. That is, the connecting member 40 and the positive electrode terminal 38 are electrically connected via the welded portion 42 by laser welding, and the connecting member 40 and the first external connecting terminal 20d are electrically connected via the welded portion 24 by laser welding.

In the semiconductor module 10b, on the side of the rear surface of the first external connection terminal 20d extending outward from the resin case 12b, which is opposite to the surface of the welded portion 24 melted by laser welding, and which faces the second external connection terminal 16b and the insulating layer 18a thereon, a space 26c is provided. The space 26c is formed by bending the first external connection terminal 20d inside the resin case 12b so as to be separated from the insulating layer 18a inside the resin case 12b and extending it to the outside of the resin case 12b. In the semiconductor module 10b, the first external connection terminal 20d extending outward from the resin case 12b, the space 26c therebelow sandwiched with the insulating layer 18a, the insulating layer 18a, and the second external connection terminal 16b are arranged directly below the welding portion 24 to be laser welded to the connecting member 40.

As described above, in the semiconductor module 10b, the space 26c is provided between the first external connection terminal 20d extending outward from the resin case 12b and the insulating layer 18a directly under the welded portion 24 so that the first external connection terminal 20d extending outward from the resin case 12b does not come into contact with the insulating layer 18a. The space 26c functions as a non-contact portion that prevents the first external connection terminal 20d extending outward from the resin case 12b from coming into contact with the insulating layer 18. The space 26c forms an air layer directly below the welded portion 24 so that the first external connection terminal 20d does not come into direct contact with the insulating layer 18a. Therefore, when the welded portion 24 becomes hotter than the melting point of the first external connection terminal 20d by laser welding, the heat is blocked by the space 26c and is not directly transferred to the insulating layer 18a, and the thermal damage to the insulating layer 18a directly under the welded portion 24 is significantly reduced. As a result, it is possible to effectively suppress deformation of the insulating layer 18a by heat and the resulting reduction of the withstand voltage of the terminal portion 14c that would otherwise occur. Further, since deterioration of the insulating layer 18a due to heat is suppressed, it is possible to use an insulating layer 18a having a low heat resistant temperature.

By adopting the terminal portion 14c having the above configuration, a high-quality and high-performance semiconductor module 10b and a high-quality and high-performance semiconductor device in which such the semiconductor module 10b and the capacitor 30 are connected can be obtained.

Figure 8:
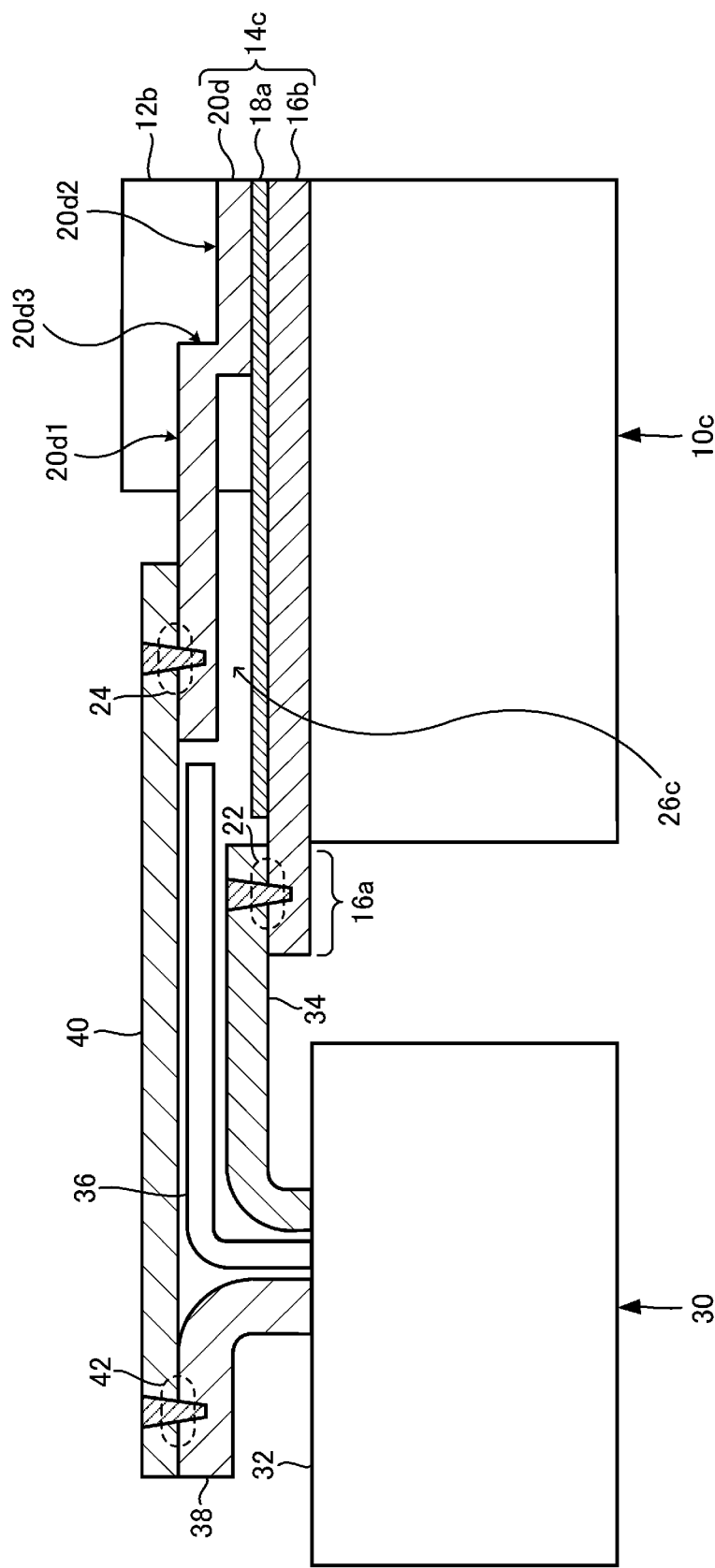
FIG. 8 is a cross-sectional view showing a modified example of the connection mechanism of the semiconductor module according to the fifth embodiment.

FIG. 8 is a cross-sectional view showing a modified example of the connection mechanism of the semiconductor module of the fifth embodiment. In FIG. 8, the same or equivalent components as those shown in FIGS. 1 and 7 are designated by the same reference numerals, and detailed description thereof will be omitted.

The semiconductor module 10c shown in FIG. 8 differs from the semiconductor module 10b in that, like the example of the semiconductor module 10a (FIG. 6) described in the fourth embodiment above, a rear surface region 16a of the second external connection terminal 16b directly below the welded portion 22 on the surface opposite to the surface joined to the negative electrode terminal 34 of the capacitor 30 is configured so as not to come into contact with the resin case 12b. That is, as in the semiconductor module 10c shown in FIG. 8, the second external connection terminal 16b may be provided so as to protrude from the outer circumference of the resin case 12b. In this way, the resin case 12b is formed so as to avoid directly under the welded portion 22, so that when the negative electrode terminal 34 of the capacitor 30 is laser welded to the second external connection terminal 16b, the heat is not transferred to the resin case 12b, and it is possible to prevent the resin case 12b from being deformed or discolored.

Here, this configuration of the fifth embodiment may be adopted to the terminal portion 14b of the third embodiment (FIG. 5). That is, the second external connection terminal 16 and the insulating layer 18 of the terminal portion 14b of the third embodiment may be extended linearly into the resin case 12, respectively, and the first external connection terminal 20c of the third embodiment may be extended inside the resin case 12 and bent so as to come into contact with the insulating layer 18 inside the resin case 12. Alternatively, the fifth embodiment and its modified example described above (FIGS. 7 and 8) may adopt the features of the third embodiment described above. That is, in the semiconductor module 10b and the semiconductor module 10c (FIGS. 7 and 8) of the fifth embodiment and its modification, the first external connection terminal 20d extending to the outside of the resin case 12b may be provided with protrusions 26b of the third embodiment, serving as a spacer with respect to the insulating layer 18a.

In addition, in the semiconductor module 10b and the semiconductor module 10c (FIGS. 7 and 8) of the fifth embodiment and its modification, the first external connection terminal 20d extending to the outside of the resin case 12b may be provided with groove 26 of the first embodiment described above, or the recess 26a of the second embodiment described above, or a combination of the groove 26 or the recess 26a and the protrusion 26b.

Sixth Embodiment

An example of the method for manufacturing the semiconductor devices as described above will be described as a sixth embodiment.

Figure 9:
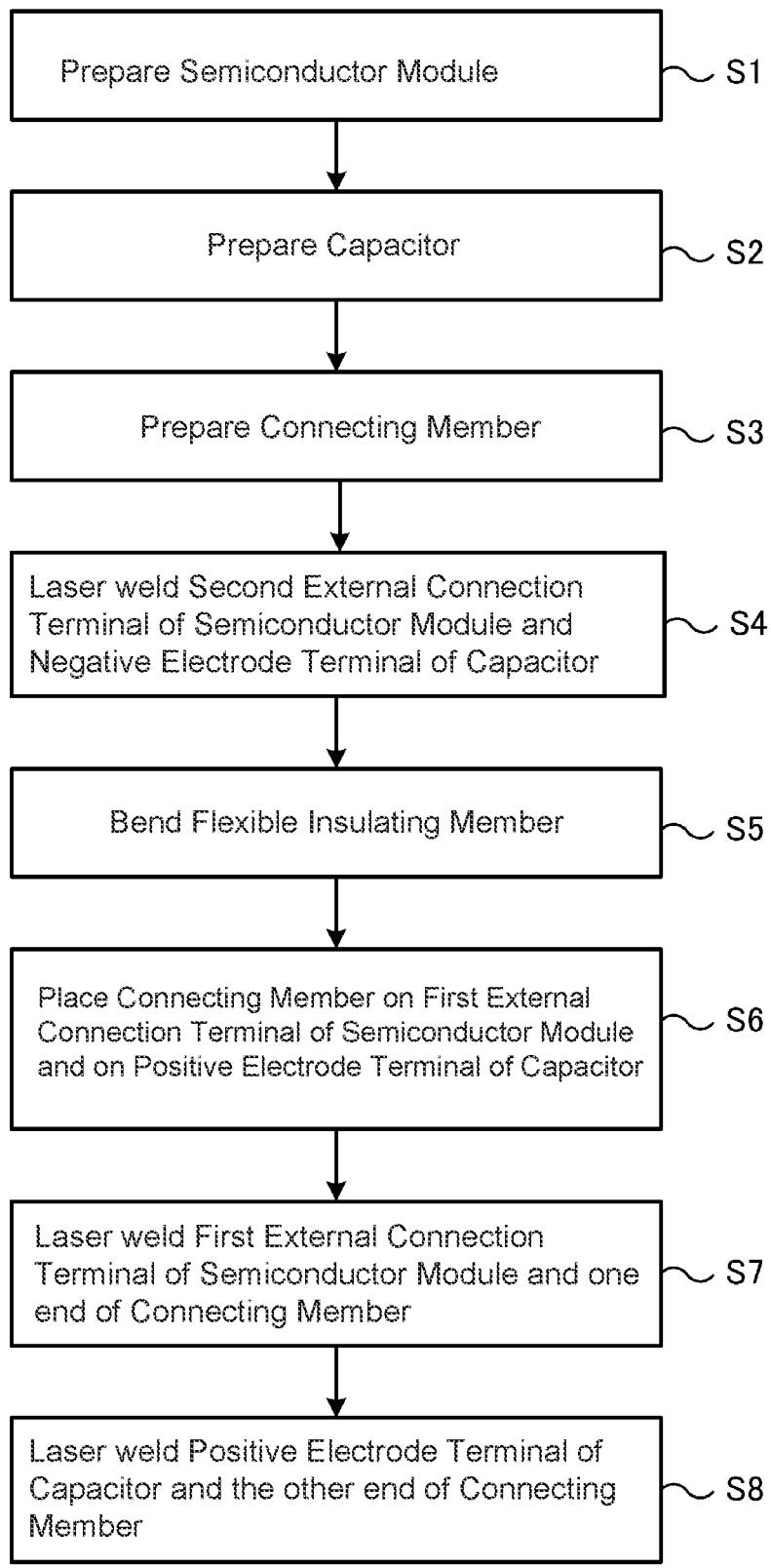
FIG. 9 is a diagram illustrating a method of manufacturing a semiconductor device according to a sixth embodiment.

FIG. 9 is a diagram illustrating a method of manufacturing a semiconductor device according to the sixth embodiment.

In this exemplary manufacturing method of the semiconductor device, a semiconductor module having any of the configurations as described in the first to fifth embodiments above, for example, the semiconductor module 10, the semiconductor module 10a, the semiconductor module 10b, the semiconductor module 10c, or the like is prepared (step S1). Further, the capacitor 30 as described above, which is to be connected to the semiconductor module 10 or the like prepared in step S1, is prepared (step S2). Furthermore, the connecting member 40 as described above used for connecting the semiconductor module 10 or the like prepared in step S1 and the capacitor 30 prepared in step S2 is prepared (step S3). The order of steps S1 to S3 does not matter.

After preparing the capacitor 30, the connecting member 40, and the semiconductor module 10 or the like, next, the second external connection terminal 16 (16b) of the semiconductor module 10 and the like and the negative electrode terminal 34 of the capacitor 30 are laser welded at the welded portion 22 (step S4). To do this, the negative electrode terminal 34 is placed on the second external connection terminal 16 (16b), and the welded portion 22 is irradiated with the laser beam from the side of the negative electrode terminal 34. As a result, the negative electrode terminal 34 and the second external connection terminal 16 (16b) are laser welded and electrically connected.

After laser welding the negative electrode terminal 34 and the second external connection terminal 16 (16b), the flexible insulating member 36 of the capacitor 30 is bent so as to cover the welded portion 22 (step S5).

Next, the connecting member 40 is placed on the first external connection terminal 20 (20b, 20c, 20d) of the semiconductor module 10 and the like and on the positive electrode terminal 38 of the capacitor 30 (step S6).

Then, the first external connection terminal 20 (20b, 20c, 20d) and one end of the connecting member 40 placed on the first external connection terminal 20 (20b, 20c, 20d) are laser welded at the welded portion 24 (step S7), and the positive electrode terminal 38 and the other end of the connecting member 40 on the positive electrode terminal 38 is laser welded at the welded portion 42 (step S8). To do this, the welded portion 24 and the welded portion 42 are irradiated with laser light from the side of the connecting member 40. As a result, the connecting member 40 and the first external connection terminal 20 (20b, 20c, 20d) are laser welded and electrically connected, and the connecting member 40 and the positive electrode terminal 38 are laser welded and electrically connected. The order of steps S7 and S8 does not matter.

Thus, in this example, the semiconductor device is manufactured using steps S1 to S8.

In the manufacture of semiconductor devices, as described above, the groove 26, the recess 26a, the protrusions 26b, and/or the space 26c, constituting a non-contact portion, are formed between the first external connection terminal 20 (20b, 20c, 20d) and the insulating layer 18 (18a) directly under the welded portion 24. Therefore, an air layer is formed directly below the welded portion 24 so that the first external connection terminal 20 (20b, 20c, 20d) does not come into direct contact with the insulating layer 18 (18a). Therefore, when the welded portion 24 becomes hotter than the melting point of the first external connection terminal 20, (20b, 20c, 20d) by laser welding, the heat is blocked by the air layer and does not directly reach the insulating layer 18 (18a). Because of this, the thermal damage to the insulating layer 18 (18a) directly under the welded portion 24 is reduced. As a result, deterioration of the insulating layer 18 (18a) due to heat and a decrease in withstand voltage due to the deterioration can be suppressed. Therefore, a high-quality and high-performance semiconductor device in which the high-quality and high-performance semiconductor module 10 or the like and the capacitor 30 are connected is realized.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
a resin case housing a semiconductor element;
an insulating layer extending outward from the resin case in a plane perpendicular to a thickness direction, the insulating layer being in contact with the resin case; and
a first external connection terminal extending outward from the resin case in a plane perpendicular to the thickness direction, the first external connection terminal being in contact with the resin case and being arranged above the insulating layer so as to face the insulating layer in the thickness direction, thereby creating an overlapping area in which the first external connection terminal and the insulating layer overlap with each other when viewed in the thickness direction, the first external connection terminal having a non-contact portion that is not in contact with the insulating layer in the thickness direction in at least a portion of the overlapping area.

2. The semiconductor module according to claim 1, wherein the insulating layer extends linearly into the resin case, and
wherein the first external connection terminal further has a first portion facing the insulating layer above the insulating layer inside the resin case, a second portion in contact with the insulating layer inside the resin case, and a third portion having both ends bent and connected to the first portion and the second portion, respectively, inside the resin case.

3. The semiconductor module according to claim 1, wherein the first external connection terminal is in contact with the insulating layer outside the resin case, and the non-contact portion is a recess formed on a surface of the first external connection terminal that is in contact with the insulating layer.

4. The semiconductor module according to claim 3, wherein the recess extends in a direction that intersects a direction extending from the resin case outward.

5. The semiconductor module according to claim 4, wherein the non-contact portion has an oval shape or a rectangular shape in a plan view.

6. The semiconductor module according to claim 1, wherein the first external connection terminal has at least one protrusion on a surface in the vicinity of the non-contact portion.

7. The semiconductor module according to claim 6, wherein a distance of the protrusion from the resin case is greater than a half of a distance of an end of the first external connection terminal from the resin case.

8. The semiconductor module according to claim 1, wherein an entire surface, on a side of the insulating layer, of a portion of the first external connection terminal extending outward from the resin case is the non-contact portion.

9. The semiconductor module according to claim 1, further comprising a second external connection terminal on a surface of the insulating layer opposite to the first external connection terminal.

10. The semiconductor module according to claim 9, wherein the second external connection terminal projects outward from an outer circumference of the resin case in a plan view.

11. A semiconductor device, comprising:
the semiconductor module as set forth in claim 1; and
a capacitor having a first terminal and a second terminal,
wherein the first external connection terminal and the second terminal of the capacitor are electrically connected by laser welding via a laser welded portion of the first external connection terminal.

12. The semiconductor device according to claim 11, further comprising:
a flat plate-shaped connecting member, one end of which is connected to the first external connection terminal, and the other end of which is connected to the second terminal of the capacitor,
wherein the laser welded portion is provided at a connection portion of the first external connection terminal and the connecting member and another laser welded portion is provided at a connection portion of the second terminal and the connecting member.

13. A semiconductor device, comprising:
the semiconductor module as set forth in claim 9; and
a capacitor having a first terminal and a second terminal,
wherein the second external connection terminal and the first terminal of the capacitor are electrically connected by laser welding via a laser welded portion of the second external connection terminal and the first terminal.

14. A method of manufacturing a semiconductor device, comprising:
preparing a semiconductor module that includes:
a resin case housing a semiconductor element,
an insulating layer extending outward from the resin case in a plane perpendicular to a thickness direction, the insulating layer being in contact with the resin case, and
a first external connection terminal extending outward from the resin case in a plane perpendicular to the thickness direction, the first external connection terminal being in contact with the resin case and being arranged above the insulating layer so as to face the insulating layer in the thickness direction, thereby creating an overlapping area in which the first external connection terminal and the insulating layer overlap with each other when viewed in the thickness direction, the first external connection terminal having a non-contact portion that is not in contact with the insulating layer in the thickness direction in at least a portion of the overlapping area;
preparing a capacitor having a first terminal and a second terminal; and
electrically connecting the first external connection terminal of the semiconductor module and the second terminal of the capacitor by laser welding via a laser welded portion.

15. The method according to claim 14, wherein the laser welded portion that electrically connects the first external connection terminal and the second terminal is formed by radiating a laser beam from a side of the first external connection terminal opposite to the non-contact portion.

16. The method according to claim 14, further comprising:
electrically connecting the second external connection terminal of the semiconductor module and the first terminal of the capacitor by laser welding via another laser welded portion.

17. The method according to claim 14,
wherein the semiconductor module further includes a flat plate-shaped connecting member, one end of which is connected to the first external connection terminal, and the other end of which is connected to the second terminal of the capacitor, and
wherein the method includes:
laser welding the first external connection electrode and a connection portion of the connecting member and laser welding the second terminal of the capacitor and the another connection portion of the connecting member.

18. The semiconductor module according to claim 1, wherein the first external connection terminal has a contact portion that is in contact with the insulating layer in a portion of the overlapping area.

19. The semiconductor module according to claim 1, wherein the first external connection terminal has a coplanar peripheral portion completely surrounding the non-contact portion, the peripheral portion of the first external connection terminal being in direct contact with the insulating layer.

20. The method according to claim 14, wherein the first external connection terminal has a contact portion that is in contact with the insulating layer in a portion of the overlapping area.

* * * * *